United States Patent [19]

Prammer et al.

[11] Patent Number: 4,761,614
[45] Date of Patent: Aug. 2, 1988

[54] DEVICE AND METHOD FOR AUTOMATIC SHIMMING OF NMR INSTRUMENT

[75] Inventors: Manfred G. Prammer, Philadelphia; John C. Haselgrove, Swarthmore, both of Pa.

[73] Assignee: Phospho-Energetics, Inc., Philadelphia, Pa.

[21] Appl. No.: 42,882

[22] Filed: Apr. 27, 1987

[51] Int. Cl.⁴ ............................................. G01R 33/20
[52] U.S. Cl. ..................................... 324/320; 324/307
[58] Field of Search ............... 324/300, 307, 309, 308, 324/312, 310, 314, 319, 320, 322

[56] References Cited

U.S. PATENT DOCUMENTS

| | | | |
|---|---|---|---|
| 2,507,301 | 5/1950 | Fulbright | 361/146 |
| 3,488,561 | 1/1970 | Anderson | 361/146 |
| 3,735,306 | 5/1973 | Kabler et al. | 336/192 |
| 4,443,760 | 4/1984 | Edelstein et al. | 324/309 |
| 4,484,138 | 11/1984 | Bottomley et al. | 324/307 |
| 4,523,166 | 6/1985 | Gross | 324/320 |
| 4,558,277 | 12/1985 | Post et al. | 324/309 |
| 4,585,992 | 4/1986 | Maudsley et al. | 324/309 |
| 4,591,789 | 5/1986 | Glover et al. | 324/309 |
| 4,661,775 | 4/1987 | Kormos et al. | 324/312 |
| 4,680,551 | 7/1987 | O'Donnell et al. | 324/320 |

OTHER PUBLICATIONS

M. D. Sauzade and S. K. Kan, "High Resolution Nuclear Magnetic Resonance Spectroscopy in High Magnetic Fields", Orsay, France.
K. Sekihara, S. Matsui and H. Kohno, "NMR Imaging for Magnets With Large Non-Uniformities", p. 1052, Tokyo, Japan.
K. Sekihara, S. Matsui and H. Kohno, "A New Method of Measuring Static Field Distribution Using Modified fourier NMR Imaging", Tokyo, Japan.
F. Romeo and D. I. Hoult, "Magnet Field Profiling: Analysis and Correcting Coil Design", NIH, Bethesda, Md.
W. A. Anderson, "Electrical Current Shims for Correcting Magnetic Fields", The Review of Scientific Instruments, vol. 32, No. 3, Mar. 1961.
A. A. Maudsley and S. K. Hilal, "Field Inhomogeneity Correction and Data Processing for Spectroscopic Imaging", Columbia Univ.
A. A. Maudsley, S. K. Hilal, W. H. Perman and H. E. Simon, "Spatially Resolved High Resolution Spectroscopy by 'Four-Dimension' NMR", Columbia University.
Harry S. Dewhurst, H. N. Yeung, D. W. Kormos, "Correction for Magnetic Field Inhomogeneity", Technicare Corporation.
J. Haselgrove, K. Gilbert and J. S. Leigh, "Chemical-Shift Imaging Using Filtered Back-Projection Algorithms", Univ. of Penn. and Phospho-Energetics, Inc.

*Primary Examiner*—Michael J. Tokar
*Attorney, Agent, or Firm*—Browdy and Neimark

[57] ABSTRACT

A device and method for rapidly performing automatic magnet shimming using algebraic techniques, based on field maps computed by phase measurement within Carr-Purcell echo sequences. The correction computation for determining shim currents is carried out by a linear programming algorithm which compensates field inhomogeneities within the sample by a linear combination of all the shims. The procedure is non-iterative, thus avoiding instability problems and improving speed performance.

34 Claims, 2 Drawing Sheets

DEVICE AND METHOD FOR AUTOMATIC SHIMMING OF NMR INSTRUMENT

BACKGROUND OF THE INVENTION

The present invention is directed to means and methods for automatically adjusting currents in shim coils for improving homogeneity of the main magnet field for nuclear magnetic resonance (NMR) instruments. The term "shimming" in this art denotes the process of compensating inhomogeneities in the main magnet field. The name can be traced back to the time when large resistive electromagnets were used for NMR. Coarse adjustments were done by placing thin brass pieces between the magnet and the poles in order to align the pole faces. The metal pieces employed were shim stock, and thus the procedure was called "shimming". Today a shim set is a combination of electromagnets within the magnet's bore, each of which is designed to produce a specific magnetic field profile. In principle, the maximum achievable field homogeneity is limited only by the number of these shims, whereas in practice the winding tolerances are the limiting factor.

The homogeneity requirements span a wide range. Several tens of parts per million (ppm) deviation are acceptable for clinical imaging if it can be maintained over the cross-section of a body, while a few parts per billion (pph) in some milliliters are required in high-resolution spectroscopy.

Coarse, permanent field errors due to shielding in the magnet's environment and due to manufacturing imperfections should be countered by superconducting shim coils. They are adjusted after the magnet has been brought up to field and do not consume power afterwards. Changes in the environment and susceptibility variations of the sample itself must be compensated by room-temperature shim coils. Adjusting the currents in these coils can be a time-consuming procedure when done by hand, since it traditionally involves repetitive observation of the free induction decay FID signal and/or its lineshape. The shim currents can be iteratively adjusted following a fixed protocol, until the apparently "best" line shape is found.

Ideally, automatic shimming by a computer should yield a specific homogeneity over a desired region in a fraction of the time required for a human operator to achieve the same homogeneity. The hardware requirements are computer-controllable shim power supplies. Conventional autoshim software emulates to some extent the way a human operator would proceed. A start-up sequence follows a fixed protocol to bring up the field such as from a totally unadjusted state. Then a search algorithm is invoked which changes the settings one at a time by different step values. A measure of field quality is computed from the incoming FID signal, from which the program determines whether or not to proceed in that direction or to try another change. It is hoped in the prior art that such a "blind search" will converge after a number of iterations to an acceptable field optimum. NMR studies benefit greatly from on-line field adjustment, for instance the "ppm vs. volume" figure could be optimized differently in the course of an experiment. The possibility of selecting a region of interest within the sample by "focussing" a homogeneous field onto this area would provide much better spectral resolution and signal-to-noise ratio.

A first problem with the prior art approach is that, since the FID signal is the volume integral over the entire sample, it is not known what parts of the field need to be adjusted. Secondly, it is difficult to define a "figure-of-merit" which describes the quality of the signal. A popular measure is the total area under the FID signal, but other optimization criteria may be preferable, depending on the application. Thirdly, all search algorithms are inherently slow since they must wait after every change for the coil currents to settle before the next scan can be started. Fourthly, if the set of applicable shim-sets is not orthogonal over the volume of the sample, then it is necessary to perform a large number of iterations. Finally, there is no guarantee that the search will find the globally best result. Experience shows that iterative searches fail on complex, second-order interactions between the shim components, as discussed further below.

This disclosure is with reference to the following publications as background within which the present invention arises.

1. A. A. MAUDSLEY, S. K. HILAL, W. H. PERMAN and S. E. SIMON, J. Magn. Reson. 51, 147 (1983).
2. J. HASELGROVE, K. GILBERT and J. S. LEIGH, J. Magn. Reson. Med. 2, 195 (1985).
3. W. A. ANDERSON, Rev. Sci. Instrum. 32, 241 (1961).
4. W. A. ANDERSON and J. T. ARNOLD, Phys. Rev. 9, 497 (1954).
5. M. D. SAUZADE and S. K. KAN, Adv. Electronics Electron. Phys. 34, 1 (1973).
6. F. ROMEO and D. I. HOULT, J. Magn. Reson. Med. 1, 44 (1984).
7. A. A. MAUDSLEY, A. OPPELT and A. GANSSEN, Siemens For. u. Entw.-Ber. 8, 326 (1979)
8. A. A. MAUDSLEY, H. E. SIMON and S. K. HILAL, J. Phys. E: Sci. Instrum. 17, 216 (1984).
9. A. A. MAUDSLEY and S. K. HILAL, J. Magn. Reson. Med. 2, 218 (1985).
10. K. SEHIKHARA, S. MATSUI AND H. KOHNO, J. Phys. E: Sci. Instrum. 18, 224 (1985).
11. K. SEKIHARA, S. MATSUI and H. KOHNO, Soc. Magn. Reson. Med., Abstr. 2, 1052 (1985).
12. H. S. DEWHURST, H. N. YEUNG and D. W. KORMOS, Soc. Magn. Reson. Med., Absr. 1, 199 (1985).
13. K. STEIGLITZ, "Digital Signal Processing", in "Fundamentals Handbook of Electrical & Computer Engineering I" (S.S.L. CHANG, Ed.), pg. 255, John Wiley, 1982.
14. R. ESCH, "Functional Approximation", in "Hardbook of Applied Mathematics" (C. E. PEARSON, Ed.), p. 928, Van Nostrand Reinhold Company, 1983.
15. G. B. DANTZIG, "Linear Programming and Extensions", Princeton University Press, Princeton, 1963.
16. K. G. MURTY, "Linear Programming", John Wiley, New York, 1983.
17. D. SOLOW: "Linear Programming", North-Holland, New York, 1984.
18. S. I. GASS, "Linear Programming", McGraw-Hill, New York, 1985.

Romeo and Hoult (6) have discussed the general framework with which any field may be analyzed in terms of spherical harmonic components, and they describe the theoretical advantages to be gained by considering zonal and tesseral components separately. In practice it is desired to analyze as rapidly as possible a particular field in terms of a given set of shimming gradients, each of which may deviate from the single, respective component it was designed to ideally simulate.

SUMMARY OF THE INVENTION

The present invention is directed to an alternative shimming method and device, based on imaging techniques, which can provide the advantage that a shim can be completed within a few minutes, the region for which the field is to be optimized can be easily definable, and the finding of a global optimum can be ensured.

The data acquisition according to the present invention is based on field imaging, in other words on a field plot or map, rather than on the FID signal or observed line shape. The present invention involves an algebraic procedure for analyzing such a field plot in terms of a set of gradient functions, and which then computes all correction settings simultaneously without further change of the shim currents. The current implementation can be provided in for instance 3 minutes, and reductions are to be expected with faster algorithms and processors.

According to the present invention, the object of rapidly analyzing a field in terms of the shims is done by measuring the field and the effects of shims directly, without resolving them into spherical harmonic components. An imaging technique is used to record a field plot over the sample, and then the coefficient, that is, the current, for each shim which gives an optimal approximation to a uniform field is computed.

The present invention is also directed to use of a 3-echo Carr-Purcell sequence for obtaining field maps, to obtaining field maps therewith for determination of field contributions of shimming coils, and to determining optimal combinations of shimming coils for main field compensation.

The present invention is further directed to a method of modifying a field plot to correct for the intrinsic distortions caused by the nonuniformity in the field.

DESCRIPTION OF PREFERRED EMBODIMENTS

The magnetic field of a main magnet is generally a vector field $B(x, y, z)$, each component of which depends on position $x,y,z$. (Bold type is used herein to indicate vector and matrix quantities.) This field can be represented by a constant field strength $B_o$ generally assumed to be along the z-axis and a small, unwanted, additive error $\delta B(x, y, z)$. Because of the relative magnitudes generally prevailing, it is the component of error along the main magnet field which becomes of principal concern, namely the z-axis component of the error vector field, which is denoted in the following by $\delta B(x, y, z)$. The correction system must be capable of approximately compensating for $\delta B(x, y, z)$ in the desired homogeneous region. Historically, only linear combinations of orthogonal eigenfunctions have been used to provide sufficient independence of the coefficients as to be manageable by manual shimming. Of these, spherical harmonics lead to relative simple coil configuration designs and have been used almost exclusively (3-6).

Such prior art shim controls currently are designed to simulate respective spherical harmonic components, which can be expressed in cartesian components. Some of these components are listed in Table 1, the middle column showing the function, the left column the common name for the function, and the right column the interaction order. An interaction of order zero denotes a (theoretically) non-interacting function that may be optimized independently of all the others. Function of order 1 are dependent on each other, but can be adjusted in a fixed, repetitive sequence. Order 2 interactions can be resolved only by stepping through each one of them while recording the maximum signal available by optimizing all other shims. The shim interactions become much more complicated when the sample's center does not coincide with the center of the shim set, and are further complicated by the sample's size and its local susceptibility distribution.

TABLE 1

Names and functions of the room-temperature shims.

| Name | Function | Interaction order |
| --- | --- | --- |
| Z0 | 1 | 0 |
| Z1 | z | 0 |
| Z2 | $2z^2 - (x^2 + y^2)$ | 1 |
| Z3 | $z[2z^2 - 3(x^2 + y^2)]$ | 2 |
| Z4 | $8z^2[z^2 - 3(x^2 + y^2)] + 3(x^2 + y^2)^2$ | 2 |
| Z5 | $48z^3[z^2 - 5(x^2 + y^2)] + 90z(x^2 + y^2)^2$ | 2 |
| X | x | 0 |
| Y | y | 0 |
| XY | xy | 1 |
| $X^2 - Y^2$ | $x^2 - y^2$ | 1 |
| ZX | zx | 2 |
| ZY | zy | 2 |
| $Z^2X$ | $x[4z^2 - x^2 + y^2)]$ | 2 |
| $Z^2Y$ | $y[4z^2 - (x^2 + y^2)]$ | 2 |
| ZXY | zxy | 2 |
| $Z(X^2 - Y^2)$ | $z(x^2 - y^2)$ | 2 |
| $X^3$ | $x(x^2 - 3y^2)$ | 1 |
| $Y^3$ | $y(3x^2 - y^2)$ | 1 |

The approach of the present invention can be completely free of limitations inherent in such prior art approaches to shimming as discussed above.

Field Imaging

Figure 1:
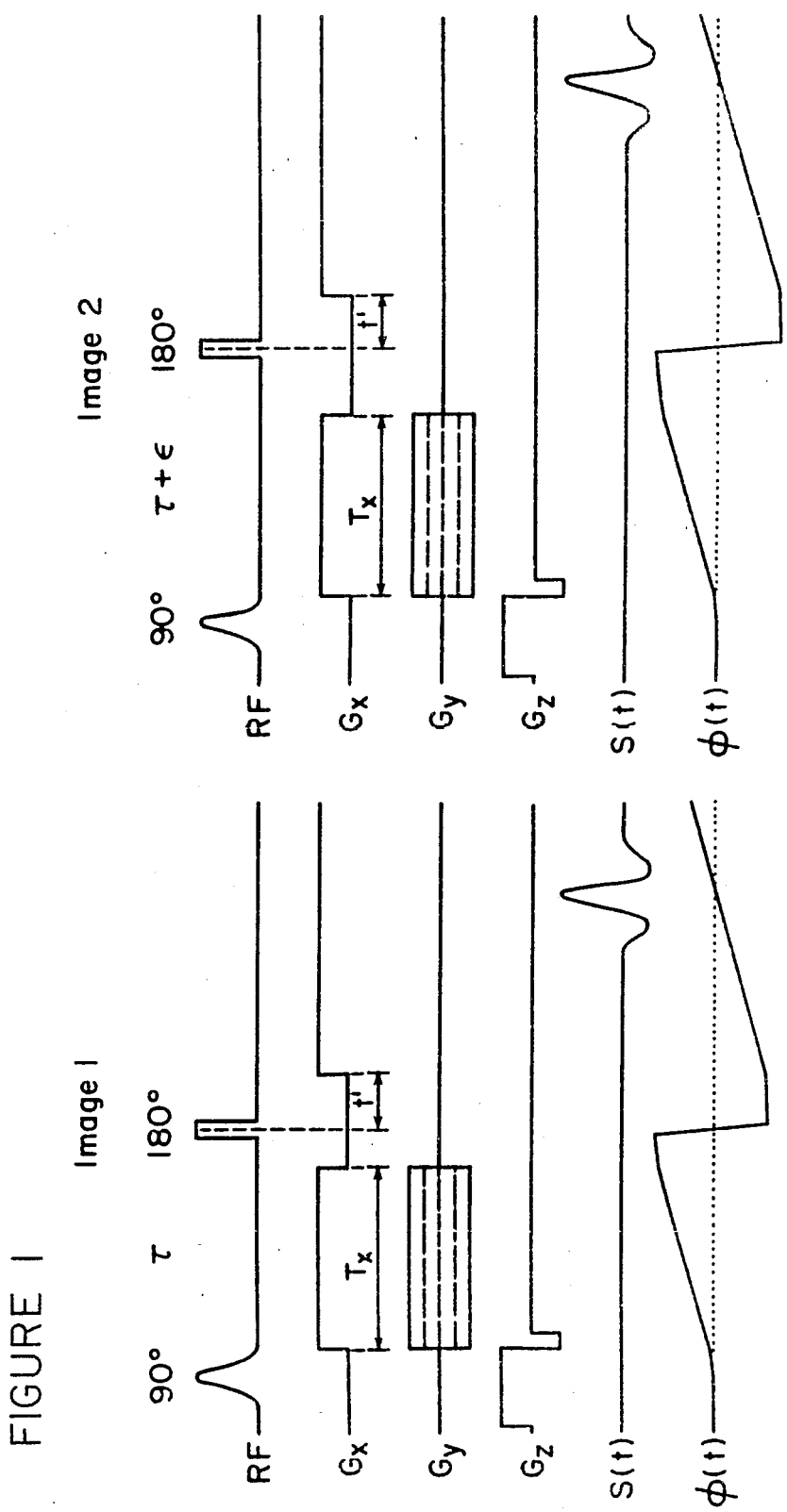
FIG. 1 shows waveforms for field imaging using two separate scans. In Scan 2 the timing of the observed gradient is delayed by the time delay $\epsilon$.

As outlined first by Maudsley and co-authors (7-9), any chemical shift imaging method may be used to map the inhomogeneities of the main magnet field. However, such techniques are inherently slow, because it is intrinsically inefficient to collect a spectrum at each spatial point in order to derive a single scalar value, i.e. the magnitude of the local field. The modified Fourier imaging method proposed by Sekihara et al. (10,11) has been adapted and extended according to a feature of the present invention, in order to obtain fields plots rapidly. Proceeding from Dewhurst et al (12), it was found that utilization of the phase difference between a field map and a reference image greatly improves the accuracy of the teohnique, since field non-uniformity of first order and gradient-induced eddy currents are compensated. FIG. 1 outlines the pulse and acquisition sequences which were used to test the Dewhurst technique. The figure shows the protocol pertinent to collecting a field plot of a single plane, where the gradient $G_z$ of the magnet field along the z-axis is used to select a slice. A three-dimensional plot is derived by stacking consecutive slices, or by phase encoding the z direction as well as the y direction with a non-selective hard 90°-pulse. A pulse sequence in which the timing of the gradients is varied, rather than the timing of the pulses, would give similar information.

Figure 2:
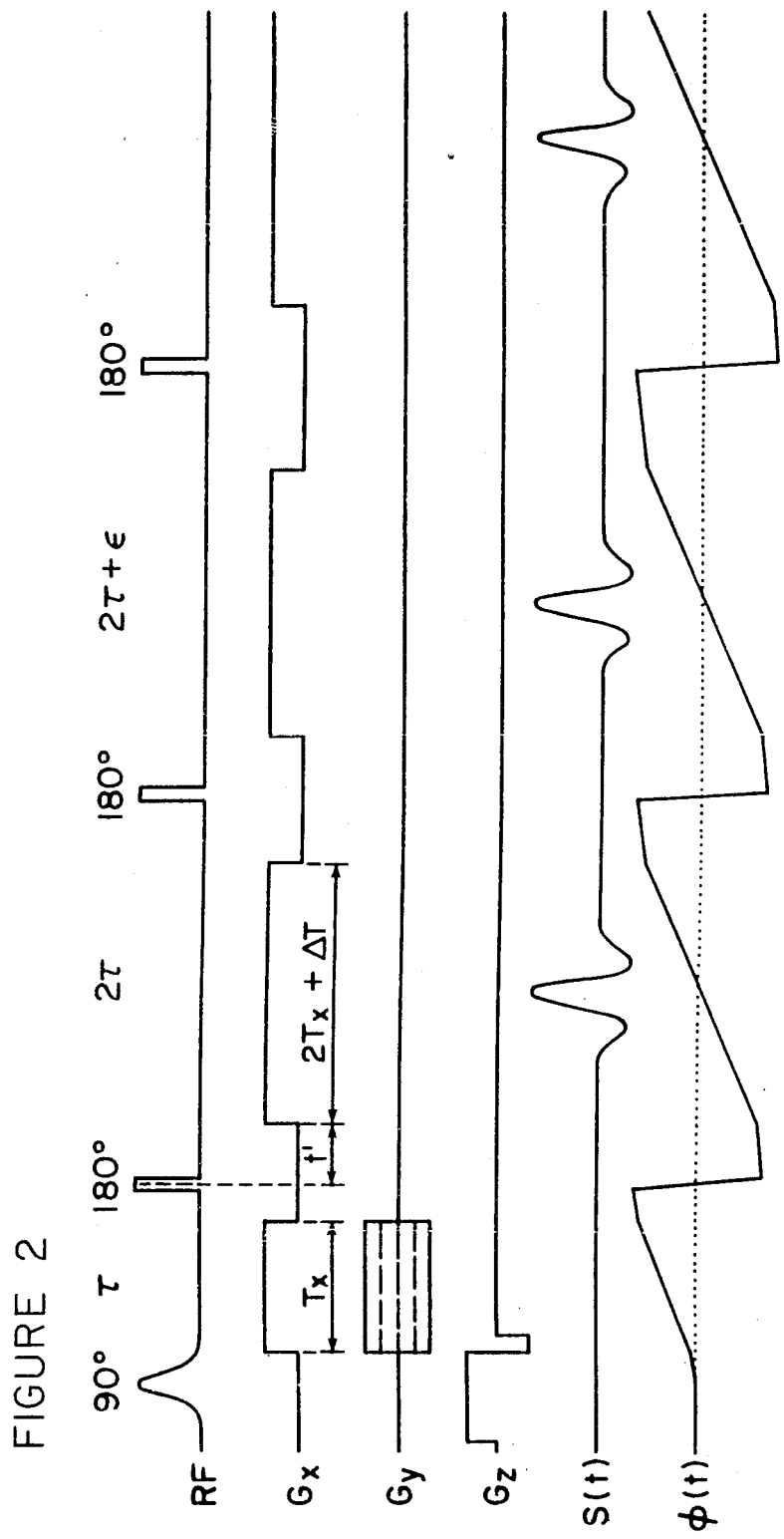
FIG. 2 shows waveforms for field imaging using a modified Carr-Purcell echo sequence according to the present invention. The third 180°-pulse is delayed by the time $\epsilon$. The phase difference between the first and third echoes depends on the local value of the magnetic field.

According to a further feature of the present invention, where a protocol is used in which TR (the conventional symbol for the time between successive scan sequences) is much longer than TE (the time between the 90° pulse and the center of the spin echo), it is possible to speed up the data acquisition process by a factor of 2 by generating a Carr-Purcell echo sequence adapted to collect data for both images in one TR period. The principle is demonstrated in FIG. 2. A pulse sequence $$90° - \tau - 180° - (2\tau) - 180° - (2\tau + \epsilon) - 180°  \quad [1]$$

generates 3 spin-echoes and yields the same information as the Dewhurst technique in only half as many scans. As long as the time period $2\tau$ is short enough to provide a signal amplitude sufficient to retrieve the phase, no relaxation-induced effects are encountered. The bottom traces in FIGS. 1 and 2 show the phase defined for the spin vector at a point x,y,z where the field error of interest as noted above is $\delta B(x,y,z)$. It is easy to show that the phase at time t following the 180° pulse preceding each of the three individual echoes shown in FIG. 2 is given by Echo 1: $\phi1(t,x,y,z) = \gamma\delta B(x,y,z)(t-\tau) + G_x x (t-t'-T_x)$ Echo 2: $\phi2(t,x,y,z) = \gamma\delta B(x,y,z)(t-\tau) + G_x x (t-t'-T_x-\delta T) + G_y y T_y$  [2b]

Echo 3: $\phi3(t,x,y,z) = \gamma\delta B(x,y,z)(t-\tau-\epsilon) + G_x x (t-t'-T_x) - G_y y T_y$  [2C]

where $\gamma$ is the gyromagnetic ratio, and $T_x$ and $T_y$ represent the effective times for which the gradients $G_x$ and $G_y$ are applied between the 90° and 180° pulses.

Since in practice gradients do not switch instantaneously, an effective delay $\delta T$ arises in the switching times. From these equations it is evident that odd-numbered echos are not affected by such timing skews within the gradient switching, while the even-numbered echoes are affected. The phase difference $\delta\phi(x,y,z)$ between echo 1 and echo 3 depends only on the magnitude of the field error $\delta B(x,y,z)$ and the parameter $\epsilon$.

$$\delta\phi(x,y,z) = \phi1(t,x,y,z) - \phi3(t,x,y,z) = \gamma\epsilon\delta B(x,y,z). \quad [3]$$

The field deviation $\delta B(x,y,z)$ is therefore given by $$\delta B(x,y,z) = (1/\epsilon) \arctan [Im(S_1/S_3)/Re(S_1/S_3) \quad [4]$$

where $S_1$ and $S_3$ are the complex signals of that part in the image generated from echo 1 and echo 3, respectively, and Im(w) and Re(w) indicate the imaginary and real parts of an argument w. Because the arctangent function is multi-valued for the value of its argument between $+\pi$ and $-\pi$, there are many values of $\delta B(x,y,z)$ which are a solution to Eq. [4]. Ambiguity can be avoided by choosing a value of $\epsilon$ such that the phase angle $\delta\phi(x,y,z)$ for the largest expected field error is limited to the range between $-\pi$ to $+\pi$. Thus, the range of $\gamma\delta B(x,y,z)$ which can be studied unambiguously is inversely proportional to the time delay $\epsilon$. Given a magnet field of 2T and a maximum expected error of 20 ppm, $\gamma\delta B(x,y,z)$ is about 1.7 kHz and $\epsilon$ must be set to less than 0.28 msec.

In order to correlate different field plot images, each must be corrected for the spatial distortion in the direction of the read-out gradient due to the inhomogeneity of the field (10,12). Any volume element with a local field error $\delta B(x,y,z)$ will be imaged with a positional error $\delta x$ (in cm) of $$\delta x = \delta B(x,y,z)/G_x \quad [5]$$

The correction can be written in terms of pixels as $$\delta x \text{ (in units of pixel)} = \delta B(x,y,z)$$
$$N/SW = (N/SW)(\delta\phi(x,y,z))/\epsilon \quad 8\ 6]$$

where N is the number of pixels across the whole image and SW is the frequency width of the whole image. Thus, knowing N pixels, SW and $\epsilon$ from the acquisition, and the phase difference from the field plot or image, a spatially corrected field plot can be generated.

In principle it is necessary to generate a complete three-dimensional field map by direct measurement. However, the number of picture slices to be collected can be significantly reduced in cases where control over shim terms with x, y and z simultaneously non-zero is not required. Then it is sufficient to aoquire data only from the three orthogonal planes x=0, y=0 and z=0. All examples shown below were done with this technique. The method itself is not limited by the number of dimensions.

Base Function Sets

For non-iterative control algorithms (i.e. without feedback), it is necessary to have a precise characterization of the system. In this context a field map image is needed showing the effect of each of the shim coils. These maps constitute the "base functions" for the computational algorithms. By mapping a complete set (one image per shim coefficient), all coil errors and interdependencies can be made known to the autoshim algorithm. The use of a phantom is sufficient because sample susceptibility affects the applied gradients only as second-order perturbation and can be safely neglected. Therefore, the lengthy procedure of collecting a complete base function set needs to be done only after major changes in the magnet environment.

Starting with the unshimed field, that is, the "null image", one control at a time is set for instance to 100% of the maximum adjustment range and a field map is generated. The base functions are constructed by subtracting the null image from these maps.

The Linear Programming Problem: Generation of Coefficients

Since a field as flat as possible is desired, the measured field deviation $\delta B(x,y,z)$ can be associated with an error vector E(x,y,z) in a multidimensional space, namely whose dimension corresponds to the number of points or pixels in the image plots. The best field error compensation is modelled by a linear combination of the z-axis component $B_i(x,y,z)$ of a base function set. Thus the negative of the error vector E(x,y,z) can be approximated by a similar vector H(x,y,z) given by $$H(x,y,z) = \sum_{i=1}^{n} a_i B_i(x,y,z) \qquad [7]$$

and with the number of components equal to the number of pixels. The set of $a_i$ are the unknown shim coefficients or currents that are to be determined.

In general, it is not desired to shim over the whole region for which the base functions $B_i(x,y,z)$ were recorded. Rather it is desired to optimize the shim over a specific region defined by a window function $W(x,y,z)$ corresponding to the region of interest in the sample. At present, there is no single, universal approximation which is recognized as being optimal in all circumstances. Two different criteria which meet currently accepted goals for imaging instruments and spectrometers are: the Chebyshev norm $$\max |E(x,y,z)+H(x,y,z)| W(x,y,z) \leq \mu \qquad [8]$$

where max denotes the maximum value over the field and the pair of vertical lines denotes the absolute value of the quantity therebetween; and the least squares norm $$\sum_{x,y,z} ((E(x,y,z) + H(x,y,z))W(x,y,z))^2 \leq \mu \qquad [9]$$

The shim produced by the Chebyshev criterion assures that the worst-case field error within the picture is quaranteed not to exceed a preselected value $\mu$, while the least squares approach produces a "spectroscopic shim" with a narrow lineshape, but having more pronounced sidelobes around the peak.

The implementation of both norms is described in the following, using approaches which do not depend on specific characteristics of the approximation error to be minimized. Thus a two- or three-dimensional data set can be mapped into one large-dimension field error vector, in order to utilize a generalized algorithm to solve the problem of determining the proper shim coefficients for optimizing field uniformity. A regularly- or equally-spaced data grid is not required. Data points corresponding to sample areas without sufficient signal can be left out, both in the input data set of the error vector $E(x,y,z)$ as well as in all base functions $B_i(x,y,z)$. The window $W(x,y,z)$ is set to 1 within the data range. An enormous advantage of the algorithms is that the shims need not be orthogonal over the specimen, it being sufficient that they are not linearly dependent.

Chebychev Norm

Several methods are known (13,14) for solving the problem stated in Eq. [8]. What is known as the linear programming (LP) approach offers significant advantages as the most general problem solver (15–18).

By setting the window $W(x,y,z)$ to 1 within the data range, the procedure in (14) can be followed and the problem can be rephrased in standard LP format, namely to:

$$\text{minimize } \mu, \qquad [10]$$

under the constraints $\mu + E(x,y,z) + H(x,y,z) \geq 0$ and $$\mu - E(x,y,z) + H(x,y,z) \geq 0$$

The last two lines represent 2m inequalities. In matrix notation this problem becomes to:

minimize u b [11]

under the constraints u P $\geq$ c where u is unrestricted;

wherein $\mathbf{u} = [\mu, a_1, a_2, a_3, \ldots, a_n]$ $\mathbf{b} = [1, 0, 0, 0, \ldots, 0]$ $\mathbf{c} = [E(0), -E(0), E(1), -E(1), \ldots, E(m-1), -E(m-1)]$ $\mathbf{P} =$ $$\begin{bmatrix} 1, & 1, & 1, & 1, & \ldots, & 1, & 1 \\ B_1(0), & -B_1(0), & B_1(1), & -B_1(1), & \ldots, & B_1(m-1), & -B_1(m-1) \\ B_2(0), & -B_2(0), & B_2(1), & -B_2(1), & \ldots, & B_2(m-1), & -B_2(m-1) \\ \cdot & \cdot & \cdot & \cdot & & \cdot & \cdot \\ \cdot & \cdot & \cdot & \cdot & & \cdot & \cdot \\ \cdot & \cdot & \cdot & \cdot & & \cdot & \cdot \\ B_n(0), & -B_n(0), & B_n(1), & -B_n(1), & \ldots, & B_n(m-1), & -B_n(m-1) \end{bmatrix}$$

and $E(j)$ is the value of $E(x,y,z)$ at the jth pixel, $B_i(j)$ is the value at the jth pixel of the z-axis component of the ith base function, etc. The vector u is the unknown solution vector with mu as the first element and the shim coefficients $a_i$ as subsequent elements, and n is the number of adjustable controls and base functions. b becomes a right-side vector, c is called the cost vector, and P is what is known as the problem matrix. (The usual matrix/vector multiplication is indicated by the juxtaposed quantities in bold.)

To find a unique solution, it is necessary to solve a system of 2m equations with n+1 coefficients simultaneously. Since the number of data point m is much larger than the number of coefficients n, it is more efficient to transform the LP problem of Eq. [11] into its the corresponding *primal* problem, namely to:

maximum c w [12]

under the constraints P w = b where w $\geq$ 0, w, being a new solution vector for which the LP *duality theorem* (15) states that max c w = min u b. [13]

Once the primal problem is solved, the calculation of the desired solution vector u is straightforward.

Revised Simplex Algorithm

The simplex algorithm was devised by G. B. Dantzig in the late 1940's (15–18), and is the most popular algorithm to solve a LP problem. The name relates to a special geometric interpretation of Eq. [11]. The inequality constraints may be understood as 2m planes in a n+1 dimensional hyperspace. They enclose a convex shaped hyperbody, called the Simplex. Every point within the Simplex corresponds to a solution, but only one of its vertices corresponds to an optimum, where mu is extreme. The Simplex algorithm starts out at an arbitrary point in the interior, proceeds to the surface and moves along the edges to the optimum point. Although theoretically the necessary number of calculation steps may grow exponentially with the number of dimensions, experience shows very good behavior of the algorithm for "real-world" problems.

The so-called revised version of this algorithm can be implemented according to the present invention, which offers advantages of accuracy and efficacy in solving the transformed problem of Eq. [12]. The starting point is chosen on a best-guess basis, with the first coordinates chosen randomly and the following ones adjusted to fall within the Simplex. It was determined that the number of iterations required falls into the range from $(n+1)$ to $2(n+1)$. This corresponds very accurately to performance numbers reported for different applications (18).

Other Norms

The Chebychev norm is only one method of defining an "optimum" field. Any other approximation for which the coefficients $a_i$ can be deduced by a suitable algorithm may also be used. For example, the least squares norm may be solved iteratively or by any appropriate direct method.

Algorithm Verification

The performance of the autoshim algorithm was demonstrated using a bottle of water as a phantom sample. A totally unshimmed field showed an initial error of more than 10 ppm field across a region of 5 cm diameter in a 2 T main magnet field. With 64 gradient encoding steps and a 1 sec. repetition time, the 3-plane imaging sequence took about 3 minutes. Most of the calculations were done in parallel with the acquisition, so that the additional computation overhead was only a few seconds (all tests were performed on a MicroVAX II system). A control map taken after application of the computed field correction values showed the center areas to be uniform to better than 0.1 ppm, within a 4 cm diameter 0.3 ppm was achieved, and 0.6 ppm within 5 cm. Due to the possibility that size, shape and position of the region of interest may be freely defined, virtually any homogeneity requirement realizable by the given gradient set can be met.

Chemical Shift

In-vivo application of the autoshimming must accommodate the fact that field differences are inherently indistingushable from frequency changes due to chemical shift. Without precautions for eliminating data points where lipid signal dominates over the water peak, no valid results can be expected. Such an elimination can be done interactively or by means of a decision procedure based upon a T2 picture generated from the magnitudes of echoes 1 through 3 rather than their phases.

It will be obvious to those skilled in the art that various changes may be made without departing from the scope of the invention and the invention is not to be considered limited to what is shown in the drawings and described in the specification.

We claim:

1. A method for compensating inhomogeneities in the main magnet field of a nuclear magnetic resonance (NMR) instrument having a set of shimming coils, comprising determining a plurality of fields maps of a first object with said NMR instrument, a first of said field maps being taken with the shim currents of said set of shim coils being held at a first set of respective values, and each other one of said fields maps being determined with at least one respective one of said shim currents having a different value than the respective value of said first set, determining from said field maps information on the amount of change in the field in said first object caused by each said difference in each respective shim current, and obtaining a field map of a further object with said NMR instrument with said shim currents at a further set of respective values, and calculating using a Chebychev criterion, from said information and said field map of said further object, a final set of values for said shim currents for compensating inhomogeneities in said main magnet field for investigating said further object with the NMR instrument, wherein said calculating of said final set of values for the shim currents employs a Chebychev norm for minimizing said inhomogeneities over a region of interest in said magnetic field.

2. The method of claim 1, comprising providing said further object to be the same as said first object, said determining of said first field map for said first object providing said obtaining of said field map for said further object.

3. The method of claim 1, wherein said final set of values for said shim currents are determined without iterative adjustment of said shim currents.

4. The method of claim 2, wherein said final set of values for said shim currents are determined without iterative adjustment of said shim currents.

5. The method of claim 1, said main magnet field being aligned along the z-axis, wherein each said field map is a geometrically corrected field map in which each picture element of each said field map is shifted along the "read-out gradient" axis acoording to the formula $$\delta x \text{ (in pixels)} = \delta B(x,y,z) \, (N/SW)$$

for the shift $\delta X$ along the x-axis, $\delta B\ x,y,z$ being the local value of the field inhomegeneity of the z-axis component of the main magnet field, N being the number of pixel elements along the x-axis, and SW being the sweep width of each field map.

6. The method of claim 1, wherein said determining of field maps is performed with a 3-echo Carr-Purcell sequence wherein the 180° pulses are modified so that the third 180° pulse is delayed by a delay epsilon behind its respective time in a standard Carr-Purcell sequence.

7. The method of claim 1, wherein said determining of field maps is performed with a 3-eoho Carr-Puroell sequence.

8. The method of claim 1, wherein said calculating of said final set of values for the shim currents employs a least squares norm.

9. A device for performing the method of claim 1, comprising means for automatically setting said shim currents to said final set of values after said calculating thereof.

10. The device of claim 9, wherein said means determines said information and calculates said final set of values for said shim currents, and said means also performs a geometrical correction on eaoh said field map, in which each picture element of each said field map is shifted along respective axes in correspondence to the local value of the field inhomogeneity of the main magnet field.

11. A device for performing the method of claim 2, comprising means for storing said information on the amount of change due to the respective compensating field of said shim coil, and for automatically setting said shim currents of said final set for compensating said inhomogeneities of said main magnet field in the sample.

12. A method of compensating inhomogeneities in a sample in a main magnet field aligned along the z-axis of an NMR instrument having a plurality of shim coils, comprising storing information on the z-axis component of a compensating field of each respective shim coil for a corresponding shim current, determining a field map of said main magnetic field for a sample placed in said NMR instrument, to indicate said inhomogeneities to be compensated for investigating said sample with said NMR instrument, and calculating from said information and said field map a combination of said shim currents for minimizing inhomogeneities in the magnetic field in said sample, wherein said calculating of said combination of said shim currents employs a Chebychev norm for minimizing said inhomogeneities over a region of interest in said magnetic field.

13. A method of claim 12, comprising providing a geometrical correction in said field map prior to said calculating, based on the local value of the inhomogeneity at each pixel of said field map in said sample.

14. The method of claim 12, wherein said field map is determined using a 3-echo Carr-Purcell echo sequence.

15. The method of claim 11, wherein said field map is taken in the form of three orthogonal, two-dimensional field plots.

16. The method of claim 14, wherein the stored information is provided based on differences between phantom sample and a plurality of further field maps thereof in which the shim current for each of which have respective one of said shim coils is varied, and the amount by which each said shim coil is varied.

17. The method of claim 12, wherein the stored information is provided based on a said field map of said sample and a plurality of further field maps each corresponding to varying a respective one of said shim coils by a known amount.

18. A device for performing the method of claim 12, comprising means for setting said shim currents to said optimum combination after said computing thereof.

19. A method of determining a field map of field inhomogeneities in sample in a magnetic field, comprising using a Carr-Purcell 3-echo sequence in which the period between the second and third 180°-pulses is delayed by a time period epsilon with respect to the period between a first and said second 180°-pulses.

20. The method of claim 18, comprising geometrically correcting said field plot by shifting each pixel thereof along respective axes by an amount corresponding to the local value of the field inhomogeneity, said local value of the field inhomogeneity being determined according to differences in phase between signals from said sample corresponding to said second and third 180°-pulses.

21. The method of claim 12, wherein said calculating of said combination of shim currents is non-iterative.

22. The method of claim 21, wherein said determining of said field map and said calculating with said stored information are with respect to the same respective points in said region of interest in said magnetic field, and said inhomogeneities are minimized for the set of said respective points.

23. The method of claim 22, wherein a maximum acceptable value for said inhomogeneities is selected, and set of respective points is determined in accordance with said maximumn acceptable value for said inhomogeneities and said region of interest in said magnetic field.

24. The method of claim 1, wherein said calculating is non-iterative.

25. The method of claim 1, wherein said determining of said information from said field maps and said field map of said further object for application of said Chebychev norm is with respect to the same set of points in a region of interest in said magnetic field for each said field map.

26. The method of claim 25, wherein said calculating is non-iterative.

27. A method for compensating inhomogeneity in a main magnetic field of a nuclear magnetic resonance instrument having a set of shimming coils, comprising storing a plurality of sets of data, a first of said data sets corresponding to a field map of the inhomogeneity of the main magnetic field as measured at a plurality of locations in said main magnetic field and a plurality of others of said data sets, each said further data set respectively corresponding to a field map of said inhomogeneity plus a field due to a predetermined variation in a respective shimming current in a respective one of said shimming coils, non-iteratively calculating a final set of values for said respective shim currents for said shimming coils for correcting said inhomogeneity, by applying a Chebychev criterion to said first data set, said applying of said criterion involving forming a respective sum, for each said location, of the contributions from all of said shimming coils at the respective location according to respective values of said further data sets, each said sum involving the same respective coefficient for each said shimming coil and a value determined for each said coefficient for determining each said shim current, and compensating for said inhomogeneity by providing said shim currents to said shiming coils.

28. The method of claim 27, wherein a region of interest within said main magnetic field is selected and the maximum field error for said inhomogeneity is corrected by each said shim current corresponding to each respective one of said coefficients is minimized within said region of interest by said application of said Chebychev criterion only for the respective ones of said locations within said region of interest.

29. The method of claim 27, wherein a maximum field error is specified and a region of interest wherein said maximum field error is not exceeded by said inhomogeneity as corrected by said shim currents is maximized by selection of said locations and applying said Chebychev criterion only for said selected locations.

30. The method of claim 27, wherein said locations for all of said data sets are taken anywhere at positions within the magnetic field, as long as they are at the same positions in all of said data sets.

31. The method of claim 27, wherein the shimming coils generated non-orthogonal respective correction fields with sufficient linear dependence for said determined shim current to be non-degenerate.

32. The method of claim 30, wherein said coefficients are determined by generating a set of inequality relations and solving same by means of a linear programming method.

33. The method of claim 24, wherein said said data set is with respect to locations taken throughout the full volume to be shimmed upon, in order to determine each said shim current for correcting the inhomogeneity.

34. The method of claim 27, wherein said set of shimming coils includes first order (X, Y, Z) and second order (X2-Y2, Z2, XY, XZ, YZ) shim sets, and the determination of said shim currents is carried out by utilizing three of said further data sets corresponding to fields maps of three orthogonal planes only, thereby reducing size of said data sets and execution time.

* * * * *